(12) United States Patent
Baktir et al.

(10) Patent No.: US 7,872,598 B2
(45) Date of Patent: Jan. 18, 2011

(54) ACCELERATED DECOMPRESSION

(75) Inventors: Selcuk Baktir, Worcester, MA (US);
Vinodh Gopal, Westborough, MA (US);
Gilbert Wolrich, Framingham, MA (US); Prashant Paliwal, Chelmsford, MA (US); Wajdi Feghali, Boston, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/332,083

(22) Filed: Dec. 10, 2008

(65) Prior Publication Data

US 2010/0141488 A1    Jun. 10, 2010

(51) Int. Cl.
*H03M 7/40* (2006.01)
(52) U.S. Cl. .............................. 341/67; 341/50; 341/51; 341/87
(58) Field of Classification Search .................. 341/50, 341/51, 67, 87
See application file for complete search history.

(56) References Cited

U.S. PATENT DOCUMENTS

| | | | |
|---|---|---|---|
| 5,933,104 A | * | 8/1999 | Kimura ........................ 341/87 |
| 7,538,696 B2 | * | 5/2009 | Laker et al. ................... 341/51 |
| 2004/0202374 A1 | * | 10/2004 | Venkataraman ............. 382/239 |

* cited by examiner

*Primary Examiner*—Jean B Jeanglaude
(74) *Attorney, Agent, or Firm*—Grossman, Tucker, Perreault & Pfleger, PLLC (57) ABSTRACT

Techniques for decompressing a compressed input by determining, according to an ordering of allowable codewords, an offset for a variable length codeword detected in the input; accessing a record at the determined offset in a data structure having one record for each of the allowable codewords, each record including a portion for at least one of a literal value and a length value and a portion for a type value indicative of whether the record is for a literal or a length; and determining a decompressed output based at least in part on the accessed record.

21 Claims, 8 Drawing Sheets

| Symbol | Number Extra Bits | Literal / Length(s) |
|---|---|---|
| 0-255 | 0 | 0-255 |
| 256 | 0 | end-of-block |
| 257 | 0 | 3 |
| 258 | 0 | 4 |
| 259 | 0 | 5 |
| 260 | 0 | 6 |
| 261 | 0 | 7 |
| 262 | 0 | 8 |
| 263 | 0 | 9 |
| 264 | 0 | 10 |
| 265 | 1 | 11-12 |
| 266 | 1 | 13-14 |
| 267 | 1 | 15-16 |
| 268 | 1 | 17-18 |
| 269 | 2 | 19-22 |
| 270 | 2 | 23-26 |
| 271 | 2 | 27-30 |
| 272 | 2 | 31-34 |
| 273 | 3 | 35-42 |
| 274 | 3 | 43-50 |
| 275 | 3 | 51-58 |
| 276 | 3 | 59-66 |
| 277 | 4 | 67-82 |
| 278 | 4 | 83-98 |
| 279 | 4 | 99-114 |
| 280 | 4 | 115-130 |
| 281 | 5 | 131-162 |
| 282 | 5 | 163-194 |
| 283 | 5 | 195-226 |
| 284 | 5 | 227-257 |
| 285 | 0 | 258 |

Literal/Length Symbols

| Symbol | Number Extra Bits | Distance(s) |
|---|---|---|
| 0 | 0 | 1 |
| 1 | 0 | 2 |
| 2 | 0 | 3 |
| 3 | 0 | 4 |
| 4 | 1 | 5-6 |
| 5 | 1 | 7-8 |
| 6 | 2 | 9-12 |
| 7 | 2 | 13-16 |
| 8 | 3 | 17-24 |
| 9 | 3 | 25-32 |
| 10 | 4 | 33-48 |
| 11 | 4 | 49-64 |
| 12 | 5 | 65-96 |
| 13 | 5 | 97-128 |
| 14 | 6 | 129-192 |
| 15 | 6 | 193-256 |
| 16 | 7 | 257-384 |
| 17 | 7 | 385-512 |
| 18 | 8 | 513-768 |
| 19 | 8 | 769-1024 |
| 20 | 9 | 1025-1536 |
| 21 | 9 | 1537-2048 |
| 22 | 10 | 2049-3072 |
| 23 | 10 | 3073-4096 |
| 24 | 11 | 4097-6144 |
| 25 | 11 | 6145-8192 |
| 26 | 12 | 8193-12288 |
| 27 | 12 | 12289-16384 |
| 28 | 13 | 16385-24576 |
| 29 | 13 | 24577-32768 |

Distance Symbols

```
101 Procedure construct_tables( S, bitlen, symbol, count )
102 {
103     Use bitlen[0..S] to construct
104         symbol[0..S] and count[1..15]
105         for a Huffman code table.
106 }

107 Procedure decode_next_codeword( S, count, symbol )
108 {
109     code = 0;
110     first = 0;
111     offset = 0;
112
113     for len = 1 .. N    /* N ≤ 15 */
114     {
115         /* read an additional bit from the input stream */
116             code |= getbit( );
117         /* read the number of codes of bit length len */
118             count = count[len];
119         if ( code < ( first + count ) )
120             return symbol[ offset + ( code - first ) ]
121         offset += count
122         first += count
123         first <<= 1
124         code <<= 1
125     }
126 }

127 Procedure modify_symbol( S, symbol, baselen, exbits )
128 {
129     for offset = 0..S
130     {
131         s = symbol[offset]
132         if ( 0 ≤ s ≤ 255 ) then
133         {
134             symbol[offset] =
135                 struct< type = 0, exbits = 0,
136                         literal/baselen = baselen[s] >
137         }
138         else if ( s = 256 ) then
139         {
140             symbol[offset] =
141                 struct< type = 2, exbits = 0,
142                         literal/baselen = 0 >
143         }
144         else
145         {
146             symbol[offset] =
147                 struct< type = 1, exbits = exbits[s],
148                         literal/baselen = baselen[s] >
149         }
150     }
151 }
```

FIG. 6

```
152 Procedure decode_input( S, symbol, count, baselen, exbits )
153 {
154     modify_symbol( S, symbol, baselen, exbits )
155
156     repeat
157     {
158         struct< type, exbits, literal/baselen > = decode_next_codeword();
159
160         if ( type = 0 ) then
161         {
162             output literal/baselen as a literal
163         }
164         else if ( type = 2 ) then
165         {
166             process end of block
167         }
168         else
169         {
170             deltalen = extra_bits_value( exbits )
171             length = literal/baselen + deltalen
172             distance = decode_distance( ... )
173             output repeated string of ( length, distance )
174         }
175     }
176 }
```

ACCELERATED DECOMPRESSION

BACKGROUND

This description relates to accelerated decompression.

The DEFLATE algorithm is an efficient lossless data compression algorithm which utilizes a combination of the LZ77 algorithm and Huffman encoding (*DEFLATE Compressed Data Format Specification version* 1.3, Deutsch et al., Network Working Group RFC 1951, May 1996, "RFC-1951"). In DEFLATE compression, a file is divided into a sequence of data blocks and each data block is compressed separately. An end-of-block symbol is used to denote the end of each block. The LZ77 algorithm contributes to DEFLATE compression by allowing repeated character patterns to be represented with (length, distance) symbol pairs where a length symbol represents the length of a repeating character pattern and a distance symbol represents its distance, in bytes, to an earlier occurrence of the pattern. If a character pattern is not represented as a repetition of its earlier occurrence, it is represented by a sequence of literal symbols corresponding to 8-bit byte patterns.

Figure 1:
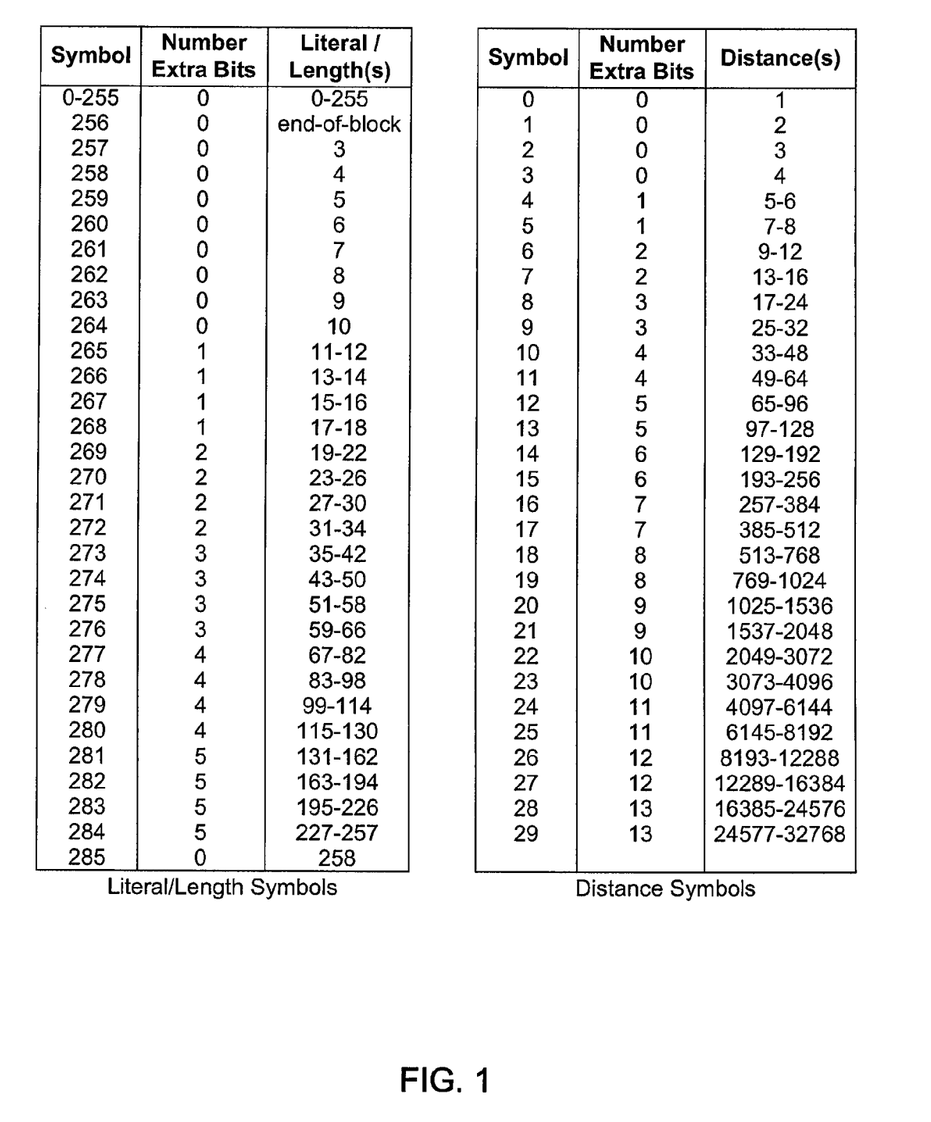
FIG. 1 is a set of tables showing the meaning of DEFLATE symbols.

Referring to FIG. 1, Huffman encoding is used in DEFLATE compression for encoding length, distance, literal, and end-of-block symbols. The literal symbols (values from 0 to 255), used for representing all 8-bit byte patterns, together with the end-of-block symbol (the value 256) and the length symbols (values 257 to 285), are encoded as literal/length codes using a first Huffman code tree. The distance symbols (represented by the values from 0 to 29) are encoded as distance codes using a separate, second, Huffman code tree. Every length symbol has two associated values, a base length value and an additional value denoting the number of extra bits to be read from the input bit-stream. The extra bits read are an integer, which is added to the base length value to give the absolute length represented by the length symbol occurrence. Likewise, every distance symbol has two associated values, a base distance value and an additional value denoting the number of extra bits to be read from the input bit-stream. The base distance value added to the integer made up of the associated number of extra bits from the input bit-stream gives the absolute distance represented by the distance symbol occurrence.

Thus, the compressed block is a hybrid of encoded literals and LZ77 look-back indicators terminated by an end-of-block indicator. As RFC-1951 explains:

> encoded data blocks in the "deflate" format consist of sequences of symbols drawn from three conceptually distinct alphabets: either literal bytes, from the alphabet of byte values (0.255), or <length, backward distance> pairs, where the length is drawn from (3.258) and the distance is drawn from (1 . . . 32, 768). In fact, the literal and length alphabets are merged into a single alphabet (0 . . . 285), where values 0 . . . 255 represent literal bytes, the value 256 indicates end-of-block, and values 257 . . . 285 represent length codes (possibly in conjunction with extra bits following the symbol code) . . . (Paragraph 3.2.5)

DESCRIPTION

Figure 2:
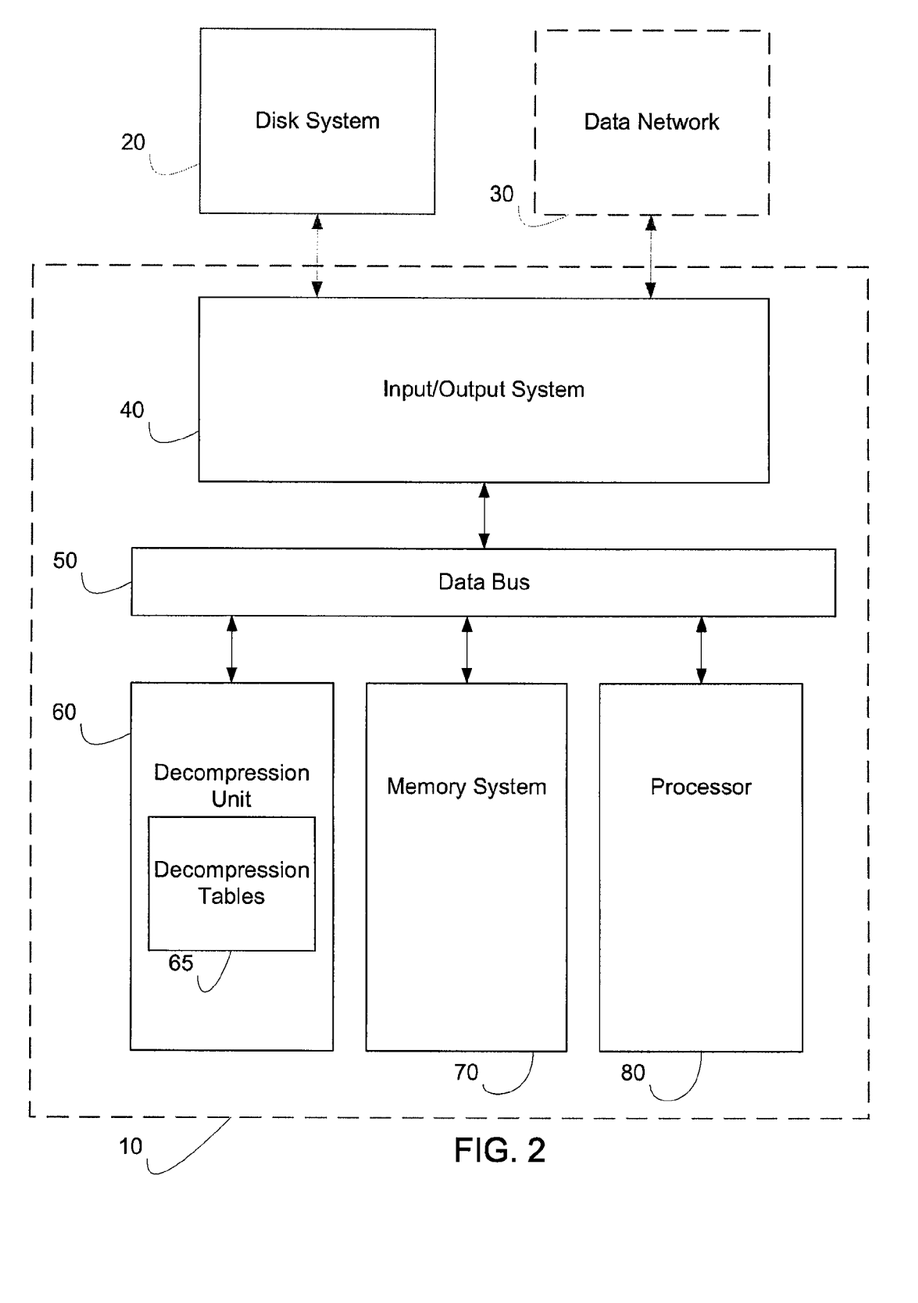
FIG. 2 is a diagram of a decompression system.

Referring to FIG. 2, in some embodiments, a data processing system includes a input/output system 40 for accepting data from a source of compressed data, such as data compressed according to a conventional DEFLATE encoding. The system includes a data bus 50 for passing data to a decompression unit 60, which includes decompression tables 65, and to a memory system 70. In some embodiments, the decompression tables are configured so that decompression of the DEFLATE encoded data make use of fewer lookups of decompression tables than conventions decompression approached, thereby providing increased decoding speed. In some examples, the input output/system 40 provides an interface to externally stored or transmitted data, for example to a disk system 20 on which compressed data may be stored on a storage device, example, a disk drive, Digital Video Disk (DVD) drive, Compact Disk (CD) drive, Redundant Array of Independent Disks (RAID), tape drive or other storage device, or to a data network link of a data network 30, for example, an Ethernet link or a physical layer network interconnection, over which compressed data is transmitted. In some examples, the decompression unit 60, as well as the processor 80 and a number of other components form an integrated unit 10, for example, provides rapid decompression of stored or transmitted data. In some examples, the decompression unit 60 is part of a content processing module (CPM) or a security services unit (SSU) of the system.

In some embodiments, a conventional DEFLATE encoding is used to compress a file (or more generally, a data stream). One approach for decoding the compressed data makes use of a first Huffman code tree that associates each symbol s value (i.e., 0 through 285) with a corresponding variable length codeword $H_s$. During decoding, when a codeword H is encountered, the value of s is recovered as a lookup s=symbol[offset(H)], where offset(H) is computed as the index of the codeword in a canonical ordering of the set of codewords used to represent the set of symbols. If s is in the range 0 to 255, then the symbol is output directly (i.e., literal=s), and if s is 256 an end-of-block (EOB) is output. On the other hand, if s is in the range 257 to 285, further processing and lookups are used to determine the length and distance where a repeated pattern previously occurred. First, lookups indexed by s are used to determine a base length (baselen[s]) and the number of extra bits (exbits[s]) following the codeword H in the input stream holding a binary representation of the incremental length (deltalen). The length of the repeated pattern is then computed as length=baselen[s]+deltalen. That is, there are three table lookups to determine the length: a first table lookup to determine the value s from H, then a second lookup to determine the base length baselen[s], and then a third lookup to determine the number of extra bits exbits[s]. Next, a second variable length codeword (H') is found in the input stream, and the symbol value looked up as s'=symbol' [offset'(H')]. From this symbol value, a base distance (basedist[s']) and number of extra bits (exbits'[s']) are looked up in a table indexed by s', and then the distance, distance, to the previous occurrence is computed as the based distance plus the value (deltadist) of the extra bits in the input stream (distance=basedist[s']+deltadist). That is, there are three further table lookups to determine the distance: a first table lookup to determine the value s' from H', then a second lookup to determine the base distance basedist[s'], and then a third lookup to determine the number of extra bits exbits'[s']. So in the case of a repeated pattern, six table lookups are used.

Figure 3:
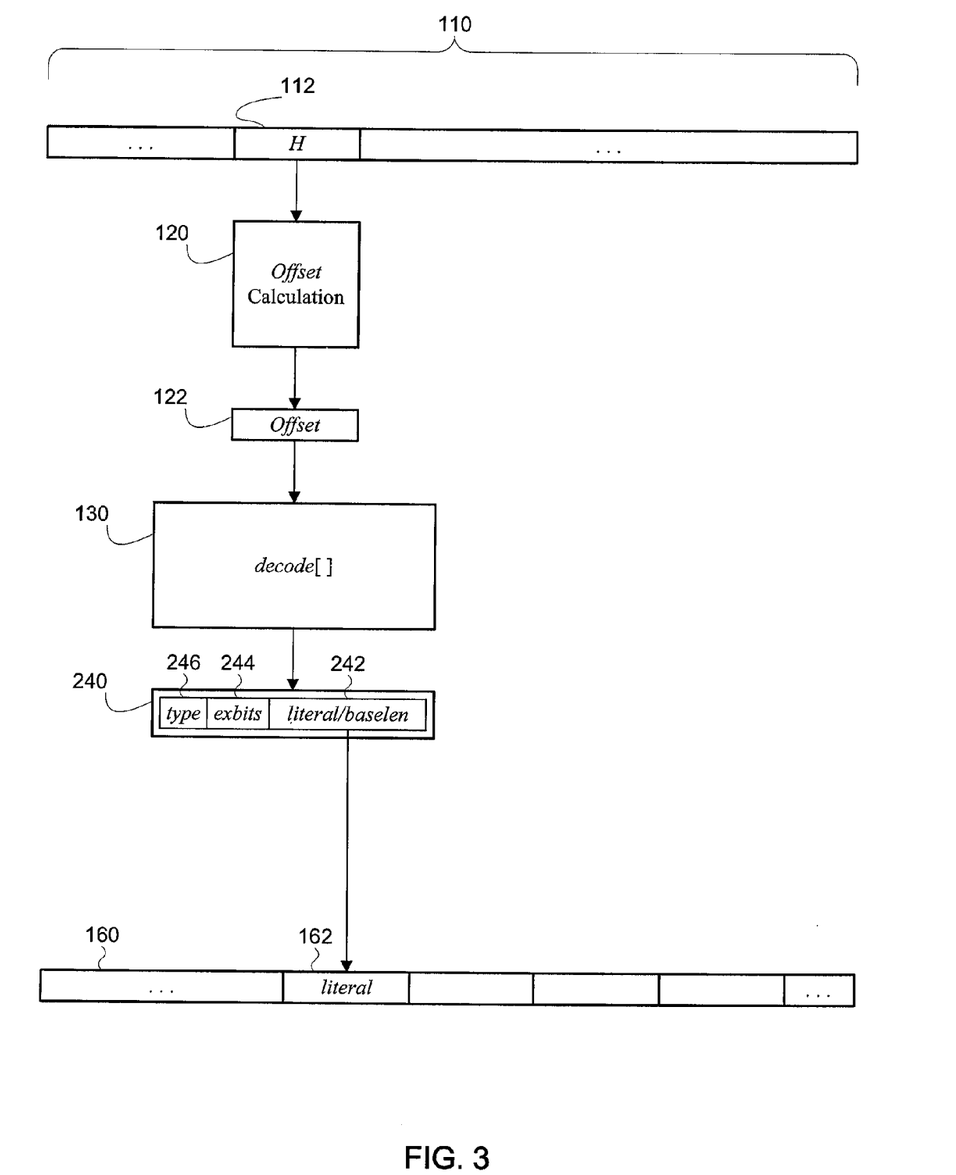
FIG. 3 is a diagram that illustrates decoding of a literal.
Figure 4:
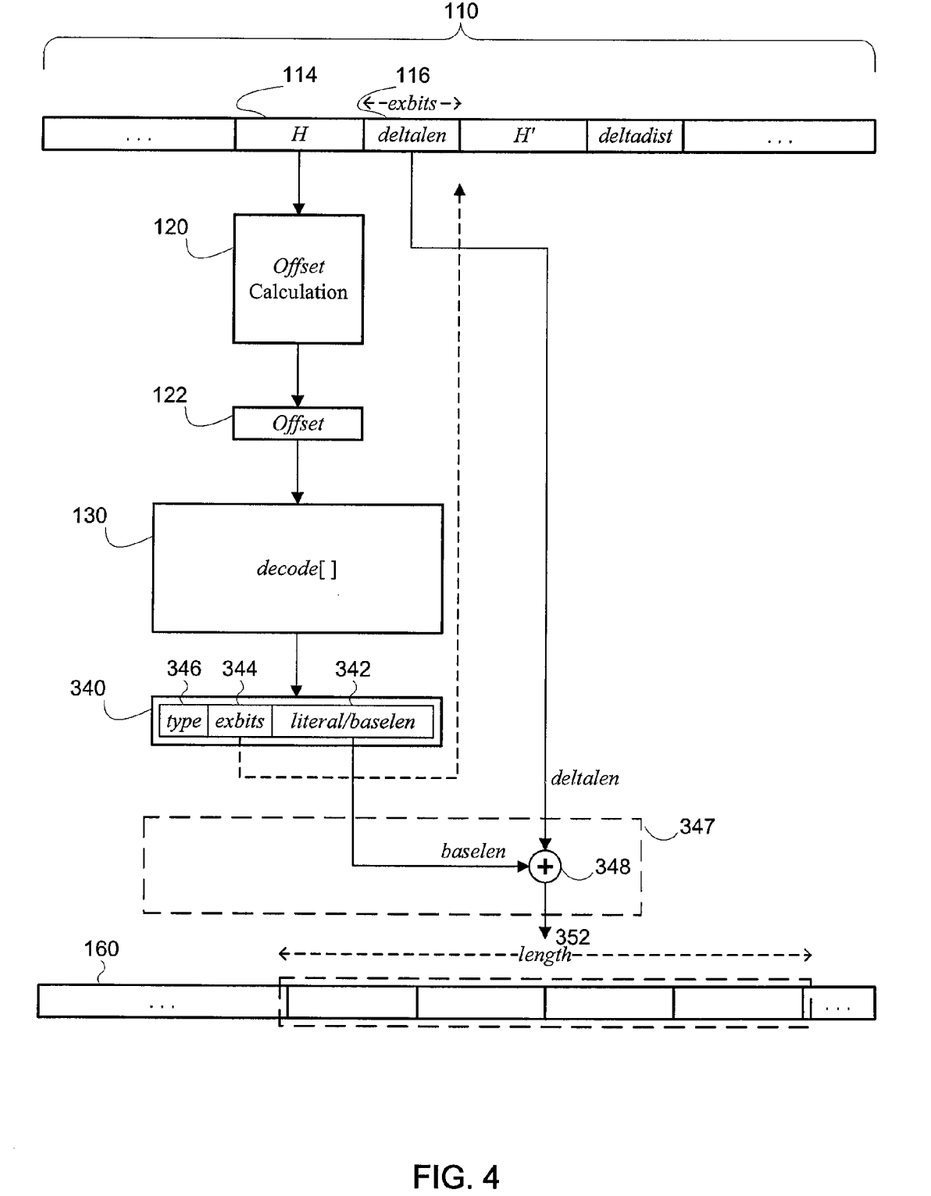
FIG. 4 is a diagram that illustrates decoding of a length.
Figure 5:
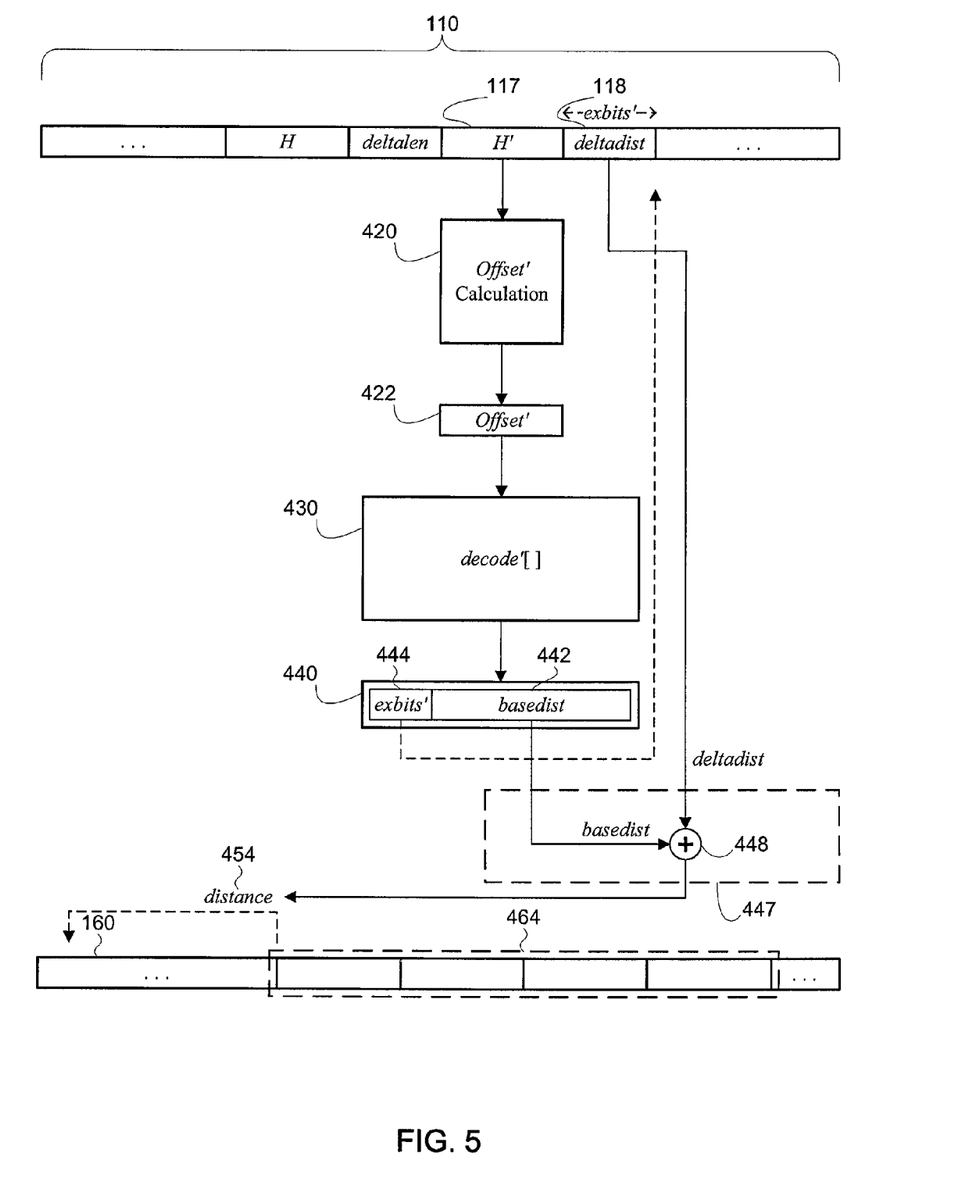
FIG. 5 is a diagram that illustrates decoding of a distance.
Figure 8:
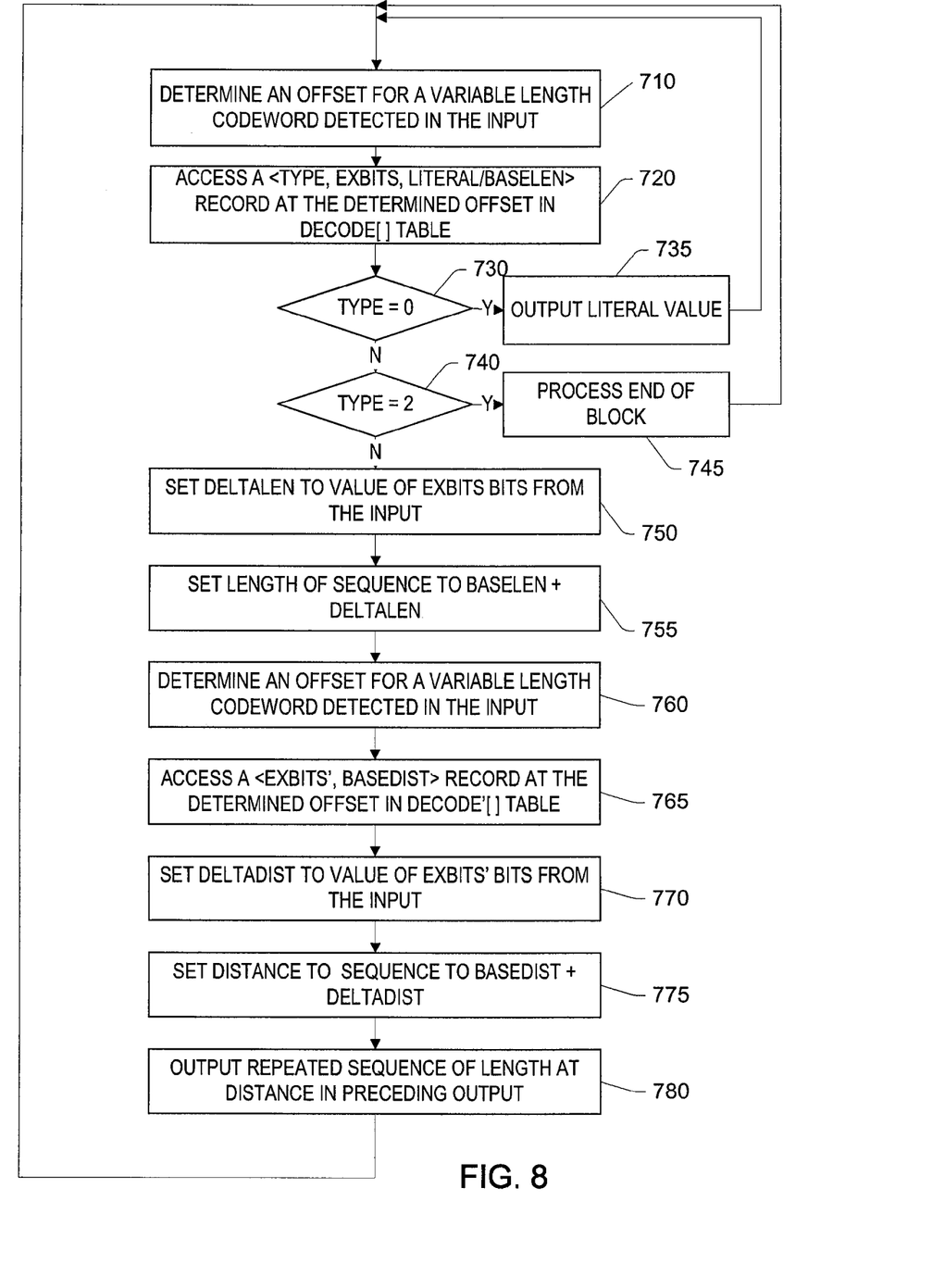
FIG. 8 is a flowchart of a decoding procedure.

Referring to FIGS. 3-5, and to a flowchart in FIG. 8, in other embodiments another approach to decompression of the compressed data in a decompression system uses decompression tables that are indexed similarly to the symbol[ ] table described above, however, only two rather than six table lookups are needed in the case of a repeated pattern. In a first table, decode[ ] 130, each record in the table corresponds to one of the variable length codewords, H. That is, for a conventional static DEFLATE encoding scheme, there are 285 records, ordered according to a canonical ordering of the Huffman codewords. Each record explicitly encodes the literal value (literal) or the base length (baselen) and number of extra bits (exbits), as well as (in some embodiments) a type field (type) that explicitly indicates whether the codeword represents a literal, a length field, or end-of-block. In some embodiments the type field is implemented as an overload on the exbits field, using otherwise unused values of exbits.

During decoding of DEFLATE encoded data 110, an offset calculation module 120 detects the occurrence of a next Huffman codeword H 112, and determines the offset 122 corresponding to that codeword (FIG. 8, block 710). The offset 122 is used to index the decode[ ] table 130 to produce a record 240 that corresponds to the detected codeword H 112 (block 720). In some embodiments, this record has three fields. A literal/baselen field 242 is used to hold one of two types of integer quantities. If the codeword corresponds to a literal value (as illustrated in FIG. 3), the literal/baselen field holds the literal value. The exbits field 244 is unused and the type field 246 indicates that the record 240 is for a literal (e.g., type=0) (block 730). This literal value is passed directly to the decompressed file 160 as the next literal 162 (block 735).

Referring to FIG. 3, in the case of decoding a literal, processing then continues with the offset calculation module 120 processing input until it determines the next codeword.

Referring to FIG. 4, if the codeword H 114 corresponds to a length value for a repeated pattern, the literal/baselen field 342 holds the base length, baselen, for the repeated pattern. A type field 346 indicates that the record 340 is for a length (e.g., type=1) (block 740 with type≠2). An exbits field 344 of the record 340 holds the number of extra bits in the input that encode the specific length relative to the base length. That is, the next exbits bits 116 of the input are extracted from the input (block 750) and added to the base length in an adder 348, which is part of a length computation module 347 (block 755), producing the length 352 of the repeated pattern. As described further below, the specific pattern of that length is located at a displacement distance earlier in the decompressed output 160. In some embodiments, the literal/baselen field uses 9 bits, and the exbits field uses 3 bits. When a literal is encoded in the literal/baselen field, the literal is stored in the least significant 8 bits (e.g., representing an ASCII character).

The type field 246/346 is used in some embodiments to represent the type of codeword. In some examples, one specific value of the field (e.g., 0) is used when the codeword represents a literal, another specific value (e.g., 1) is used when the codeword represents a length, and another value (e.g., 2) is used to represent an end of block. In some examples, the type field uses 2 bits. With 2 bits for the type field, 3 bits for the exbits field and 9 bits for the literal/baselen field, the total size of each record in the decode table 130 has 14 bits.

In some alternatives, an explicit type field 246/346 is not used. Note that in conventional DEFLATE encoding, the possible values of the exbits field are 0 through 5. Therefore, the values 6 and 7 can be used to encode the type information.

For example, the value 6 can be used to indicate a literal value, and the value 7 can be used to indicate an end of block. With 3 bits for the exbits field and 9 bits for the literal/baselen field, the total size of each record in the decode table 130 has 12 bits.

Referring to FIG. 5, when the codeword type indicates that the codeword indicates a length of a repeated pattern 464, further decoding is used to determine the distance 454. After decoding the codeword H 114, and any extra bits 116 for the length add-on value (deltalen), collectively representing the length, the distance 454 is determined according to a second codeword H' 117, and for some range of distances, exbits' extra bits for deltadist 118. As with the decoding of the codeword H 112/114, an offset calculation module 420 is used to determine the offset' 422 of the codeword (FIG. 8, block 760). Note that this codeword comes from a different set of codewords than the codeword used to encode the length, and therefore the specific calculation of the offset' differs. The offset' 422 is used to index the decode'[ ] table 430 to produce a record 440 that corresponds to the detected codeword H' 117 (block 765). In some embodiments, this record has two fields. A basedist field 442 is used to hold a base distance. An exbits' field 444 of the record 440 holds the number of extra bits in the input that encode the specific distance relative to the base distance. That is, the next exbits' bits of the input are extracted from the input (block 770) and added to the base distance in an adder 448, which is part of a distance computation module 447 (block 775), producing the distance 454 to the repeated pattern. In some embodiments, the basedist field 442 uses 15 bits, and the exbits' field 444 uses 4 bits, for a total of 21 bits in each record 440.

During decoding, after a length 352 and distance 454 are determined, the previously occurring pattern is retrieved from the decoded output 160 and output as the next sequence of literals 464 (see FIG. 4) (FIG. 8 block 780).

In some embodiments, the approach described with reference to FIGS. 3-5 is implemented in a special-purpose decoding device. Each of the tables decode[ ] 230 and decode'[ ] 430 is implemented in an addressable memory (e.g., a read-only memory (ROM) or a random access memory (RAM)). For example, when each record 240/340 uses 14 bits, the width of the memory for the decode[ ] 230 table can be 14 bits, or optionally more bits. For example, when each record 440 uses 21 bits, the width of the memory for the decode'[ ] 430 table can be 21 bits, or optionally more bits. Circuitry implementing the procedures, for example as illustrated in FIGS. 3-5, may be implemented in combinatorial logic, using a processor controlled by instructions stored in the decoding device, or using a combination of combinatorial logic and stored instructions.

Note that the offset calculation modules 120 and 420 may also make use of tables. In some embodiments, the offset calculation module 120 makes use of a count[ ] table, which indicates the number of valid Huffman codewords of each bit length. This table is used along with the canonical ordering of the codewords to detect and output the offset using conventional Huffman decoding techniques.

DEFLATE allows for both static, well-known, Huffman encodings and alternative dynamic encodings contained in header information (as a compressed form of the array bitlen[ ], described below) at the beginning of each effected block. In some embodiments, two sets of tables are used— one for the static encoding data, and a second to hold relevant dynamic encoding data.

Not shown in FIGS. 3-5 is control logic for the operation of the decoding device. Note that the type 246/346 field in the output from the decode[ ] table 120 provides an explicit representation of how the output should be handled. For example, when decoding a series of literals, the explicit type field (e.g., type=0) is provided as input to the control logic which efficiently drives depositing of the literal in the output and initiating the detection of each next codeword in the input stream. A similar approach also works when the exbits field is overloaded with type information and no type field is used.

In some embodiments, the approach described with reference to FIGS. 3-5 is implemented in software. Using conventional techniques, a set of Huffman codewords, whose lengths are selected according to the relative frequencies of the different symbols s is represented by an array symbol[ ], and a corresponding array count[ ]. That is, count[n] is equal to the number of codewords of bit length n, and symbol[offset] is equal to the value of s that corresponds to the offset codeword in the canonical ordering of the codewords. A codeword construction procedure can take an array bitlen[ ] such that bitlen [s] is the bit length for the Huffman code for symbol s in the set [0 . . . S], and produce arrays count[ ] and symbol[ ] suitable for decoding (see RFC-1951). A decoding procedure processes bits of the input until a codeword is found (e.g., based on the count[ ] array), determines the offset, and returns symbol[offset].

In some examples, after the symbol[ ] array is constructed, for example, as an array of 16- or 32-bit quantities, the symbol array is modified, substituting data structures for the symbols. The data structures explicitly identify what the replaced symbol indicated. For example, in some embodiments, symbols for lengths (s in the range [257-285]) are replaced by a structure containing the base length value (baselen[s]) indicated by the symbol s coupled with the number of extra bits to be read (exbits[s]) and an indication of the symbol type (e.g., type=1, indicating that the structure is for a length). Symbols for literals (s in the range [0-255]) are replaced by a similar structure containing the literal byte value (s) and a literal type indicator. The symbol for end-of-block (s=256) is replaced by a similar structure containing an end-of-block type indicator. In some embodiments the type indicator is a distinct field in the structure. In some embodiments the type is indicated by the value of the extra bits (as explained above). The symbol'[ ] array used for distances can be modified in a similar manner, e.g., using 32-bit quantities to store 19-bit structures holding the 15-bit base length values (basedist[s]) and the 4-bit additional bits value (exbits'[s]).

Figure 6:
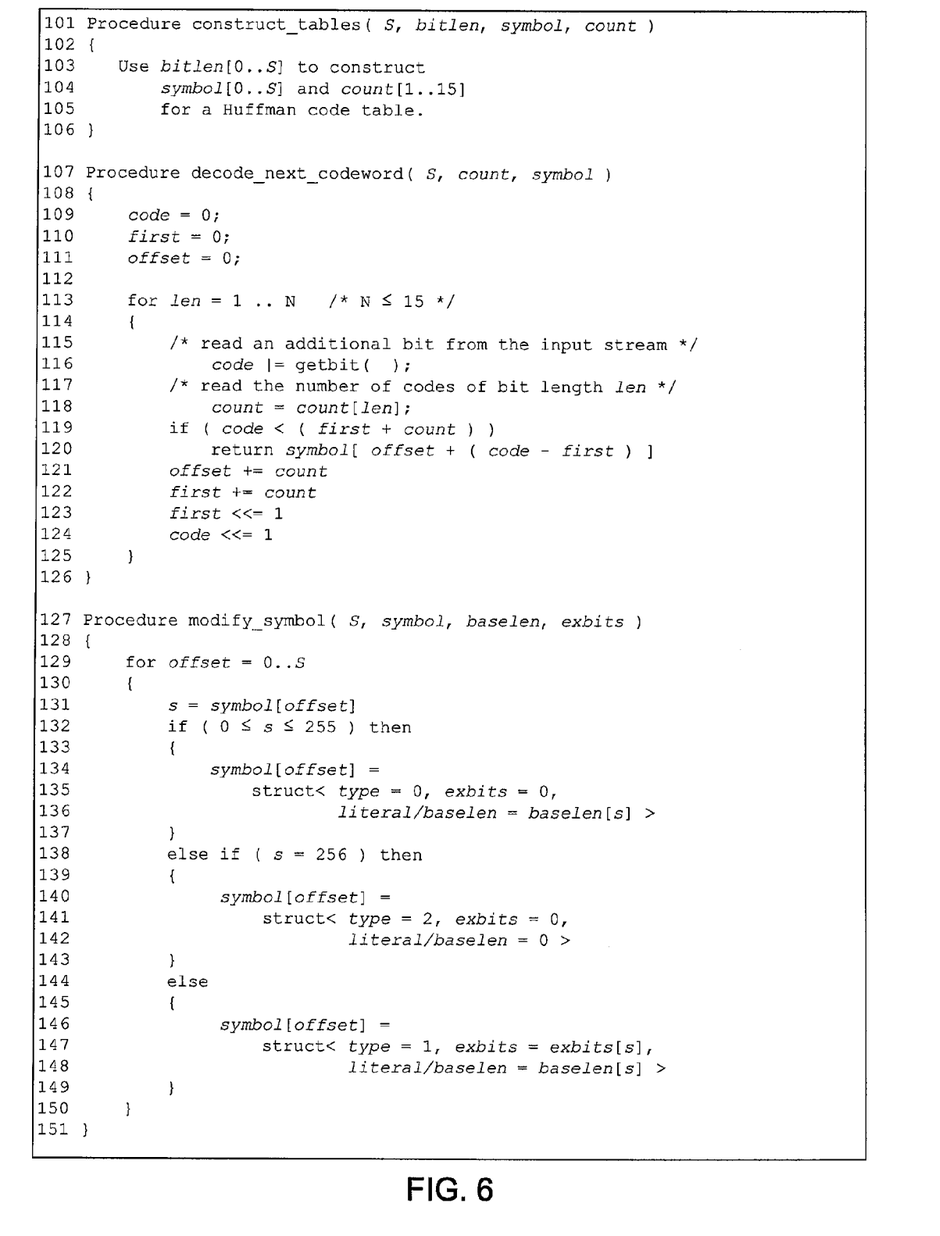
FIG. 6 is pseudocode for a software implementation.
Figure 7:
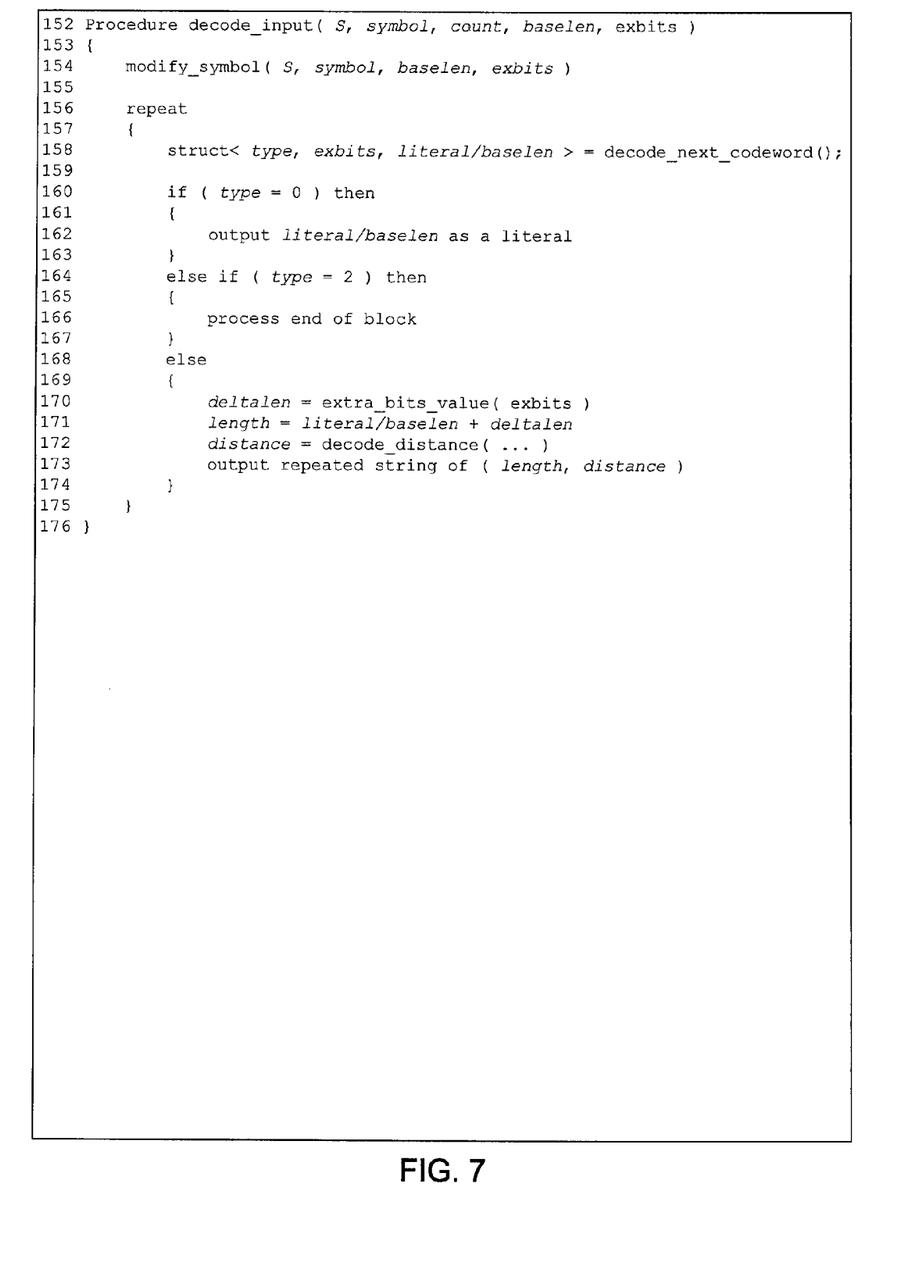
FIG. 7 is pseudocode for a software implementation.

A software implementation can be demonstrated in pseudocode. Referring to FIG. 6 and FIG. 7, a procedure construct_tables( ) uses an array bitlen[ ] to construct the symbol[ ] and count[ ] tables for the Huffman tree represented by bitlen[ ]. The bitlen[ ]array lists, in symbol order, the number of bits used in the representation. For example, the bitlen[ ] array for the static Humman tree is ([0 . . . 143]:8, [144 . . . 255]:9, [256 . . . 279]:7, [280 . . . 287]:8). Note that the Huffman tree includes unused symbols 286 and 287 for completeness. RFC-1951 presents a compression scheme for the bitlen[ ] array and explains how to covert the bitlen[ ] into each Huffman codeword/symbol relationship. These relationships are then stored in symbol[ ] and count[ ] tables.

A procedure decode_next_codeword( ) is used to extract each Huffman codeword from the compressed data. Initially support data (code, first, offset) is set to zero (lines 109-111). The procedure then extracts bits in a loop, extracting up to N bits where N is the maximal number of expected bits. A dynamic Huffman tree may use up to 15 bits per codeword; the static Huffman tree uses 7 to 9 bits per literal/length codeword and 5 bits per distance codeword. As each bit is read, the bit is appended to the codeword (line 116), the count of valid codewords for the number of bits read is updated (line 118), and the codeword is validated (line 119). If the codeword is within the range of valid codewords for the number of bits read, an offset is computed for accessing the symbol[ ] table. The computation is to take the max offset for lesser codewords (offset) plus the current codeword (code) minus the lowest possible value for the current number of bits read (first) (line 120).

If the bits read (code) is not in the valid range, the support data is updated and another bit is read. The support data is updated by incrementing the max offset for lesser codewords (offset) by count (line 121); incrementing and doubling the lowest possible value for the current number of bits read (first) (lines 122-123); and shifting the current codeword to make room for the next bit (line 124).

The procedure decode_next_codeword( ) returns the data stored in the symbol[ ] table. The procedure construct_tables( ) interprets bitlen[ ] and populate symbol[ ], typically with the symbol for each Huffman codeword at the table index associated with the codeword.

A procedure modify_symbol( ) is used to replace these intermediary symbols with the data they represent, in a structured (e.g., fixed-length bit field) format. For each symbol (line 129) the procedure examines the symbol and determines the correct table entry. Each literal is replaced with a struct indicating that the data is a literal and containing the literal value (lines 132-137). End-of-block is replaced with a struct indicating that the data is for end-of-block (lines 138-143). Each lengths is replaced with a struct indicating that the data is a length and containing the number of extra bits to be read (exbits) and the base length value (lines 144-149).

A procedure decode_input( ) decompresses a DEFLATE-compressed block of data by modifying the symbol table (if necessary) (line 154) and then repeatedly read each next codeword until end-of-block is found (lines 156-175). Because the symbol[ ] table contains structs, decode_next_codeword( ) returns a three-part struct (containing type, exbits, and literal/baselen). It is then straight forward to determine how to proceed based on type. If the type indicates a literal (e.g., type=0), then the literal/baselen field is returned as an 8-bit literal byte value (lines 160-163). If the type indicates end-of-block (e.g., type=2), then procedure is finished with the block and proceeds accordingly (lines 164-167). If the type indicates a length (e.g., type=1), then the literal/baselen field is treated as a base length value and the remaining LZ77 data is decoded (lines 168-174). An add-on value (deltalen) is extracted using the exbits field for the number of extra bits to be read. The length portion of the LZ77 look-back pair is the sum of the literal/baselen value and deltalen. The distance portion of the LZ77 look-back pair is extracted in a similar manner as the literal/baselen, using similar code but different tables. The pair is then processed, outputting the repeated string based on length and distance.

The approaches described above are not limited to use with data encoded with the DEFLATE algorithm. For example, the approached are not limited to Huffman coding approaches or compression of character sequences. For example, other sequences of fixed length or variable length units can be encoded with a hybrid literal and sequence based approach, and a single decoding table can be used such that a record accessed based on a received codeword provides the information needed to output the literal or to proceed with processing the sequence without requiring further table lookups that do not require further input values.

The techniques described herein can be implemented in digital electronic circuitry, or in computer hardware, firmware, software, or in combinations of them. The techniques can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps of the techniques described herein can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

It is to be understood that the foregoing description is intended to illustrate and not to limit the scope of the invention, which is defined by the scope of the appended claims. Other embodiments are within the scope of the following claims.

What is claimed is:

1. An apparatus comprising an integrated circuit for decompressing a compressed input, the integrated circuit comprising:
    a first storage configured to hold a plurality of records, each record including a portion for at least one of a literal value and a length value and a portion for a type value indicative of whether the record is for a literal or a length;
    a first offset calculation module configured to accept a variable length Huffman codeword detected in the compressed input, and determine, according to a first ordering of allowable Huffman codewords, an offset for accessing a record in the first storage that corresponds to the detected Huffman codeword; and
    a first data path for passing a literal value from a record of the first storage at an offset output from the first offset calculation module to an output of the circuit.

2. The apparatus of claim 1, wherein each record for a length further includes a portion for a number of extra bits.

3. The apparatus of claim 1, further comprising:
    a length computation module for combining a length value in a record of the first storage at an offset output from the first offset calculation module with a value represented in the compressed input by a number of extra bits in said record.

4. The apparatus of claim 1, further comprising:
    a second storage configured to hold a plurality of records, each record including a portion for a distance value and a portion for a number of extra bits;
    a second offset calculation module configured to accept a variable length codeword detecting in the input, and determine, according to a second ordering of allowable codewords, an offset for accessing a record in the first storage;
    a distance computation module for combining a distance value in a record of the second storage and a value represented in the compressed input by a number of extra bits in said record; and
    a second data path for passing a repeated string selected according to an output of the length computation module and the distance computation module to the output of the circuit.

5. A machine-implemented method for decompressing a compressed input comprising:
    determining, according to an ordering of allowable Huffman codewords, an offset for a variable length Huffman codeword detected in the input;
    accessing a record at the determined offset in a data structure having one record for each of the allowable Huffman codewords, each record including a portion for at least one of a literal value and a length value and a portion for a type value indicative of whether the record is for a literal or a length; and
    determining a decompressed output based at least in part on the accessed record.

6. The machine-implemented method of claim 5, wherein determining a decompressed output comprises:
    including the literal value in the decompressed output if the type value of the accessed record is indicative of a literal value; and
    including a sequence of literal values in the decompressed output if the type value of the accessed record is indicative of a length value, the sequence being determined at least in part by the length value.

7. The machine-implemented method of claim 6, wherein:
    each record for a length further includes a portion for a number of extra bits; and
    the sequence of literal values in the decompressed output has a length equal to the length value plus a value represented in the compressed input by the number of extra bits.

8. The machine-implemented method of claim 5, wherein each record for a length further includes a portion for a number of extra bits.

9. The machine-implemented method of claim 8, wherein the portion for a number of extra bits and the portion for the type value comprise a same portion.

10. The machine-implemented method of claim 5, wherein the record is for control data and the type value indicates a control option.

11. The machine-implemented method of claim 5, wherein accessing the stored data structure includes accessing a stored array.

12. The machine-implemented method of claim 5, further comprising outputting the determined decompressed output.

13. The machine-implemented method of claim 5, wherein determining a decompressed output comprises:
- determining, according to an ordering of allowable distance codewords, a second offset for a second variable length codeword detected in the input;
- accessing a record at the determined second offset in a data structure having one record for each of the allowable distance codewords, each record including a portion for a distance value and a portion for a number of extra bits;
- calculating a distance using the distance value and a value represented in the compressed input by the number of extra bits; and
- determining a decompressed output comprising a sequence of literal values based at least in part on the calculated distance.

14. An apparatus comprising an integrated circuit for decompressing a compressed input, the integrated circuit configured to:
- determine, according to an ordering of allowable Huffman codewords, an offset for a variable length Huffman codeword detected in the input;
- access a record at the determined offset in a data structure having one record for each of the allowable Huffman codewords, each record including a portion for at least one of a literal value and a length value and a portion for a type value indicative of whether the record is for a literal or a length; and
- determine a decompressed output based at least in part on the accessed record.

15. The apparatus of claim 14, further comprising an addressable memory used to contain the data structure.

16. The apparatus of claim 14, wherein the data structure is a configurable dynamic data structure used to contain records determined dynamically from the compressed input.

17. The apparatus of claim 14, wherein the data structure accessed is one of multiple data structures and the data structure accessed is selected based at least in part on the compressed input.

18. Computer-readable media encoded with software for:
- determining, according to an ordering of allowable Huffman codewords, an offset for a variable length Huffman codeword detected in the input;
- accessing a record at the determined offset in a data structure having one record for each of the allowable Huffman codewords, each record including a portion for at least one of a literal value and a length value and a portion for a type value indicative of whether the record is for a literal or a length; and
- determining a decompressed output based at least in part on the accessed record.

19. The computer-readable media of claim 18, further encoded with software for dynamically populating the data structure with records.

20. The computer-readable media of claim 18, further encoded with software for:
- determining, according to an ordering of allowable distance codewords, a second offset for a second variable length codeword detected in the input;
- accessing a record at the determined second offset in a data structure having one record for each of the allowable distance codewords, each record including a portion for a distance value and a portion for a number of extra bits;
- calculating a distance using the distance value and a value represented in the compressed input by the number of extra bits; and
- determining a decompressed output comprising a sequence of literal values based at least in part on the calculated distance.

21. A data processing system comprising:
- a source of compressed data, including at least one of disk storage device and a data network link; and
- a decompression unit coupled to the source of compressed data, wherein the decompression unit includes
  - a first storage configured to hold a plurality of records, each record including a portion for at least one of a literal value and a length value and a portion for a type value indicative of whether the record is for a literal or a length,
  - a first offset calculation module configured to accept a variable length Huffman codeword detected in the input of the decompression unit, and determine, according to a first ordering of allowable Huffman codewords, an offset for accessing a record in the first storage that corresponds to the detected Huffman codeword, and
  - a first data path for passing a literal value from a record of the first storage at an offset output from the first offset calculation module to the output of decompression unit.

* * * * *